(12) United States Patent
Cheng et al.

(10) Patent No.: US 12,068,409 B2
(45) Date of Patent: Aug. 20, 2024

(54) SEMICONDUCTOR STRUCTURE AND MANUFACTURING METHOD THEREFOR

(71) Applicant: ENKRIS SEMICONDUCTOR, INC., Suzhou (CN)

(72) Inventors: Kai Cheng, Suzhou (CN); Yu Zhu, Nantong (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 424 days.

(21) Appl. No.: 17/409,419

(22) Filed: Aug. 23, 2021

(65) Prior Publication Data

US 2021/0384341 A1    Dec. 9, 2021

Related U.S. Application Data

(63) Continuation of application No. PCT/CN2019/091533, filed on Jun. 17, 2019.

(51) Int. Cl.
*H01L 29/78*   (2006.01)
*H01L 29/20*   (2006.01)
(Continued)

(52) U.S. Cl.
CPC ...... *H01L 29/7786* (2013.01); *H01L 29/2003* (2013.01); *H01L 29/66462* (2013.01); *H01L 29/7842* (2013.01)

(58) Field of Classification Search
CPC ............. H01L 29/7786; H01L 29/2003; H01L 29/66462; H01L 29/7842; H01L 29/0623;
(Continued)

(56) References Cited

U.S. PATENT DOCUMENTS 8,124,505 B1 *   2/2012   Burnham .......... H01L 29/42316
                                            438/483
9,306,014 B1 *   4/2016   Kudymov ........... H01L 29/7787
                          (Continued)

FOREIGN PATENT DOCUMENTS

CN    102034861 A    4/2011
CN    103489911 A    1/2014
                  (Continued)

OTHER PUBLICATIONS

International Search Report issued in corresponding PCT Application No. PCT/CN2019/091533, dated Mar. 9, 2020.
(Continued)

*Primary Examiner* — Sheikh Maruf
(74) *Attorney, Agent, or Firm* — Westbridge IP LLC

(57) ABSTRACT

Disclosed are a semiconductor structure and a manufacturing method therefor, solving the problem that it is difficult for an existing semiconductor structure to deplete a carrier concentration of a channel under a gate so as to achieve an enhancement-mode device. The semiconductor structure comprises: a channel layer and a barrier layer stacked in sequence. A gate region is defined on a surface of the barrier layer; a plurality of trenches formed in the gate region. The plurality of trenches are extended into the channel layer; and a stress applying material filled in the plurality of trenches. A lattice constant of the stress applying material is greater than that of the channel layer.

20 Claims, 22 Drawing Sheets

(51) Int. Cl.
  *H01L 29/66* (2006.01)
  *H01L 29/778* (2006.01)
(58) Field of Classification Search
  CPC ............... H01L 29/1066; H01L 29/205; H01L 29/42316; H01L 29/4236
  USPC ....................................................... 257/183
  See application file for complete search history.

(56) References Cited

U.S. PATENT DOCUMENTS

| | | | | |
|---|---|---|---|---|
| 9,419,125 | B1* | 8/2016 | Schultz | H01L 29/7786 |
| 2009/0104738 | A1* | 4/2009 | Ring | H01L 29/4175 |
| | | | | 257/E21.585 |
| 2010/0025730 | A1* | 2/2010 | Heikman | H01L 29/402 |
| | | | | 257/E21.403 |
| 2010/0052015 | A1* | 3/2010 | Sato | H01L 29/872 |
| | | | | 257/E29.246 |
| 2010/0068855 | A1* | 3/2010 | Saxler | H01L 29/66462 |
| | | | | 257/E21.403 |
| 2010/0140660 | A1* | 6/2010 | Wu | H01L 27/0629 |
| | | | | 257/E29.338 |
| 2011/0127541 | A1* | 6/2011 | Wu | H01L 29/872 |
| | | | | 257/E29.002 |
| 2012/0091508 | A1* | 4/2012 | Aoki | H01L 29/66462 |
| | | | | 257/E29.246 |
| 2012/0098599 | A1* | 4/2012 | Chang | H01L 29/7787 |
| | | | | 257/77 |
| 2012/0211760 | A1* | 8/2012 | Yamada | H01L 21/0254 |
| | | | | 257/E21.403 |
| 2012/0261720 | A1* | 10/2012 | Puglisi | H01L 29/42376 |
| | | | | 257/E21.403 |
| 2012/0267640 | A1* | 10/2012 | Wu | H01L 29/205 |
| | | | | 257/E29.089 |
| 2013/0313560 | A1* | 11/2013 | Khalil | H01L 29/66469 |
| | | | | 257/E21.403 |
| 2013/0313612 | A1* | 11/2013 | Khalil | H01L 29/7848 |
| | | | | 257/E29.252 |
| 2014/0051221 | A1* | 2/2014 | Khalil | H01L 29/7786 |
| | | | | 438/285 |
| 2014/0054603 | A1* | 2/2014 | Wu | H01L 29/872 |
| | | | | 257/195 |
| 2015/0060942 | A1* | 3/2015 | Kume | H01L 29/7813 |
| | | | | 257/190 |
| 2015/0108547 | A1* | 4/2015 | Hwang | H01L 29/778 |
| | | | | 257/194 |
| 2015/0162427 | A1 | 6/2015 | Lee et al. | |
| 2015/0349124 | A1 | 12/2015 | Lu et al. | |
| 2019/0198615 | A1* | 6/2019 | Mishra | H01L 29/205 |
| 2019/0348503 | A1* | 11/2019 | Kimura | H01L 29/66462 |
| 2021/0225836 | A1* | 7/2021 | Roig-Guitart | H01L 27/0629 |

FOREIGN PATENT DOCUMENTS

| | | |
|---|---|---|
| CN | 105845723 A | 8/2016 |
| CN | 107919386 A | 4/2018 |
| CN | 109037323 A | 12/2018 |
| KR | 20150091705 A | 8/2015 |

OTHER PUBLICATIONS

Written Opinion issued in corresponding PCT Application No. PCT/CN2019/091533, dated Mar. 9, 2020.

* cited by examiner

SEMICONDUCTOR STRUCTURE AND MANUFACTURING METHOD THEREFOR

CROSS-REFERENCE TO RELATED APPLICATIONS

This application is a continuation of International Application No. PCT/CN2019/091533, filed on Jun. 17, 2019, the disclosure of which is hereby incorporated by reference in its entirety.

TECHNICAL FIELD

The disclosure relates to microelectronics technologies, in particular to a semiconductor structure and a manufacturing method therefor.

BACKGROUND

A high electron mobility transistor (HEMT) is a heterojunction field effect transistor. Taking an AlGaN/GaN heterostructure as an example, an AlGaN/GaN HEMT is usually a depletion-mode device because of an existence of a relatively strong two-dimensional electron gas in the AlGaN/GaN heterostructure, which makes it difficult to implement an enhancement-mode device. However, there are certain limitations on an application of a depletion-mode device in many places. For example, in an application of a power switching device, an enhancement-mode (normally-off) switching device is required. An enhancement-mode gallium nitride switching device is mainly used in a high frequency device, a power switching device and a digital circuit, etc., and a research on it has very important significance. To realize an enhancement-mode gallium nitride switching device, it is necessary to find a proper method to reduce a carrier concentration of a channel under a gate at zero gate voltage. Therefore, how to reduce a carrier concentration of a channel under a gate at zero gate voltage has become a research hotspot in this field.

SUMMARY

Therefore, a semiconductor structure and a manufacturing method therefor are provided in the present disclosure to solve the problem that an existing semiconductor structure is difficult to deplete a carrier concentration of a channel under a gate to realize an enhancement-mode device.

A semiconductor structure is disclosed in an embodiment of the present disclosure, including:

a channel layer and a barrier layer stacked in sequence;

a plurality of trenches formed in a gate region of the barrier layer, wherein the plurality of trenches are extended into the channel layer; and a stress applying material filled in the plurality of trenches, wherein a lattice constant of the stress applying material is greater than that of the channel layer.

In another embodiment of the present disclosure, a material of the channel layer in the semiconductor structure includes GaN, a material of the barrier layer includes AlGaN, and a material of the stress applying material includes InGaN.

In another embodiment of the present disclosure, the stress applying material of the semiconductor structure is a p-type semiconductor material.

In another embodiment of the present disclosure, the semiconductor structure further includes: a dielectric layer stacked on a surface of the barrier layer. The dielectric layer covers the barrier layer.

In another embodiment of the present disclosure, a material of the dielectric layer in the semiconductor structure comprises one or a combination of: $Al_2O_3$, AlON, SiON, $SiO_2$ and SiN.

In another embodiment of the present disclosure, the semiconductor structure further includes: a gate electrode in the gate region, a source electrode in a source region and a drain electrode in a drain region which are disposed above the barrier layer.

In another embodiment of the present disclosure, the semiconductor structure further includes: a nucleation layer and a buffer layer disposed between a substrate and the channel layer.

A method for manufacturing a semiconductor structure is disclosed in another embodiment of the present disclosure, including the following steps:

preparing a channel layer and a barrier layer stacked in sequence;

preparing, in a gate region of the barrier layer, a plurality of trenches extended into the channel layer; and filling a stress applying material in the plurality of trenches respectively, wherein a lattice constant of the stress applying material is greater than that of the channel layer.

In another embodiment of the present disclosure, the method for manufacturing a semiconductor structure further includes: preparing a dielectric layer on a surface of the barrier layer, wherein the dielectric layer covers the barrier layer.

In another embodiment of the present disclosure, the method for manufacturing a semiconductor structure further includes: preparing a gate electrode in the gate region, a source electrode in a source region and a drain electrode in a drain region which are disposed above the barrier layer.

Considering that a carrier concentration of a channel under a gate is related to a relatively strong two-dimensional electron gas existed at the heterojunction interface between the channel layer and the barrier layer, and a formation of the two-dimensional electron gas is related to a strain produced between the channel layer and the barrier layer due to a piezoelectric polarization effect. Therefore, the semiconductor structure and the manufacturing method therefor provided by embodiments in the present disclosure provide a way to deplete the carrier concentration by means of stress regulation to achieve an enhancement-mode device. Specifically speaking, since the plurality of trenches are formed in the gate region and filled with the stress applying material which may be strained due to the piezoelectric polarization effect, and the strain direction of the stress applying material due to the piezoelectric polarization effect is opposite to that of the barrier layer due to the piezoelectric polarization effect, the strain that may generate the two-dimensional electron gas can be offset. Thereby, the two-dimensional electron gas at the heterojunction interface between the channel layer and the barrier layer under the gate region can be eliminated and an enhancement-mode semiconductor switching device can be realized.

DESCRIPTION OF EMBODIMENTS

Figure 1A:
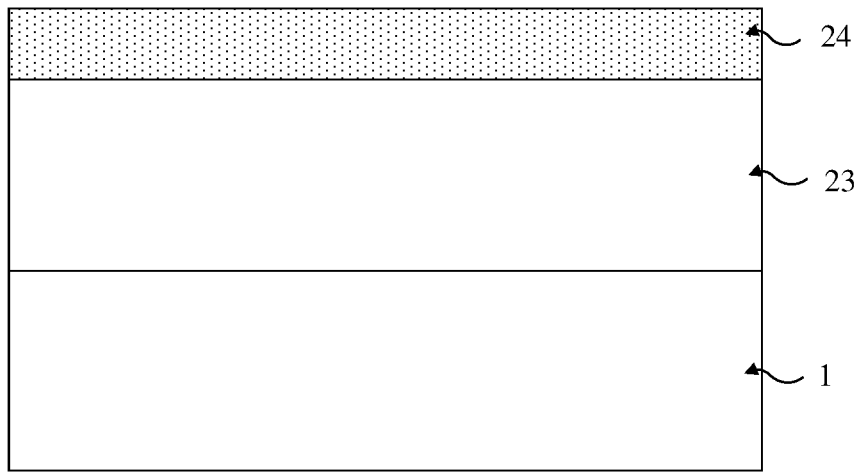
FIGS. 1a-1c, 2a-2e, 3a-3b, 4a-4b, 5a-5b, 6a-6c, 7a-7b, 8, 9a-9d, 10a-10c, 11a-11c, 12a-12c, 13a-13c, 14a-14c and 15a-15d are schematic diagrams of a semiconductor structure in a preparation process provided in an embodiment of the disclosure respectively.

Hereinafter, the present disclosure will be described in detail with reference to specific embodiments shown in the drawings. However, these embodiments shall not limit the present disclosure, and the structural, method, or functional changes made by those skilled in the art based on these embodiments shall be all included in the protection scope of the present disclosure.

In addition, repeated reference numbers or labels may be used in different embodiments. These repeated reference numbers or labels are just for a simple and clear description of the present disclosure, and do not represent any correlation between the different embodiments and/or structures discussed.

A method for manufacturing a semiconductor structure is provided in an embodiment of the present disclosure, which includes the following steps.

As shown in FIG. 1a, a channel layer 23 and a barrier layer 24 stacked in sequence are prepared on a substrate 1.

A material of the substrate 1 may be selected from a semiconductor material, a ceramic material or a polymer material, etc. For example, the material of the substrate 1 may be preferably selected from diamond, sapphire, silicon carbide, silicon, lithium niobate, silicon-on-insulator (SOI), gallium nitride or aluminum nitride.

Materials of the channel layer 23 and the barrier layer 24 may be heterojunction semiconductor materials as long as they can form a two-dimensional electron gas. For example, taking a GaN-based material as an example, the material of the channel layer 23 may be GaN and the material of the barrier layer 24 may be AlGaN. Due to the piezoelectric polarization effect, the channel layer 23 and the barrier layer 24 may form a heterostructure to produce a two-dimensional electron gas.

Figure 1B:
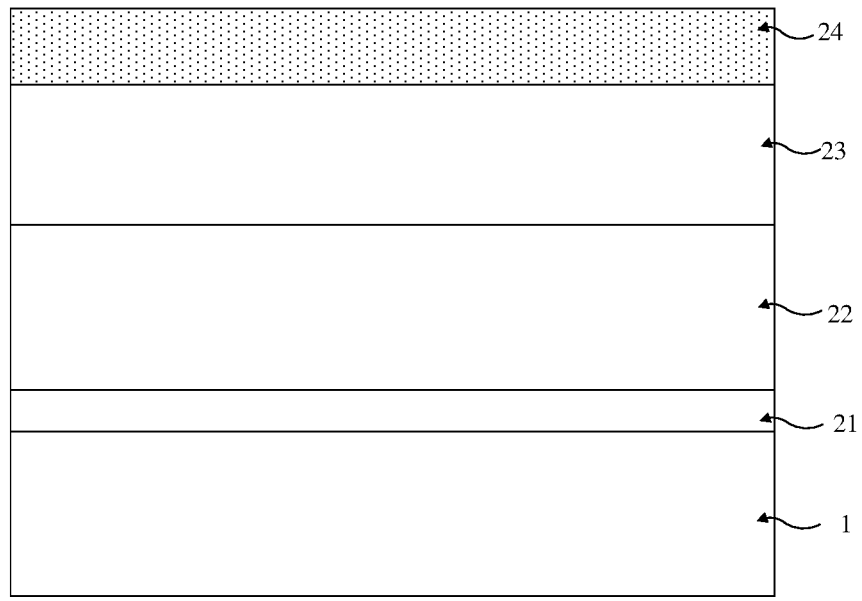

In one embodiment of the present disclosure, as shown in FIG. 1b, a nucleation layer 21 and a buffer layer 22 may be sequentially grown on the substrate 1 before the channel layer 23 is grown. Taking a GaN-based semiconductor structure as an example, the nucleation layer 21 can reduce a dislocation density and a defect density, and improve the quality of the crystal. A material of the nucleation layer 21 may be one or a combination of AlN, AlGaN and GaN. The buffer layer 22 can buffer the stress in an epitaxial structure above the substrate and prevent the epitaxial structure from cracking. A material of the buffer layer 22 may be one or a combination of AlN, GaN, AlGaN and AlInGaN.

Figure 1C:
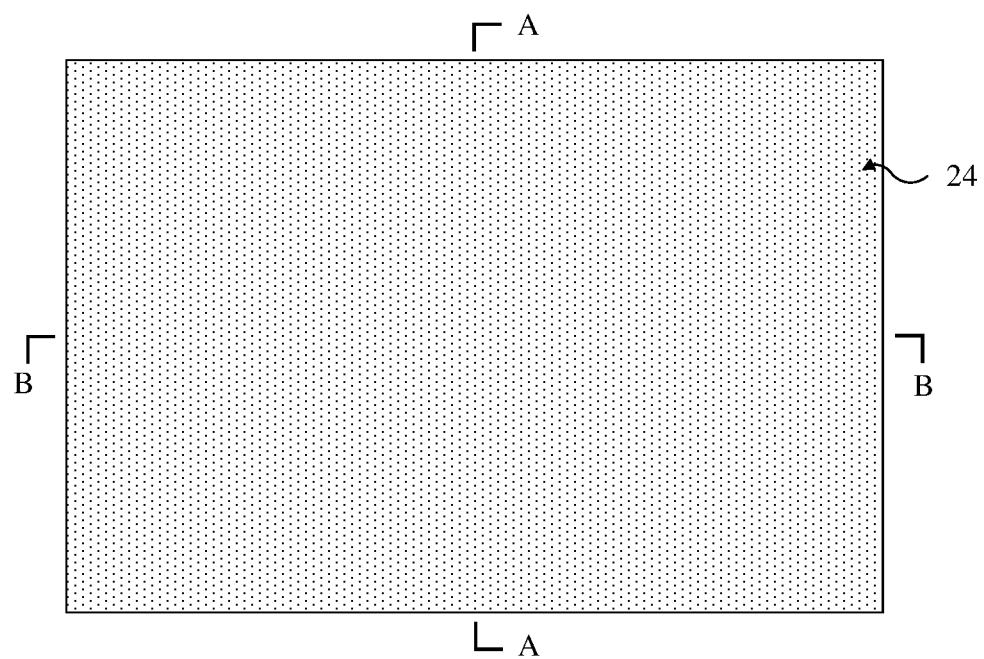

FIG. 1c is an overhead view of the semiconductor structure shown in FIG. 1a. FIG. 1a is a cross-section view along the profile line B-B of the semiconductor structure shown in FIG. 1c.

Figure 2A:
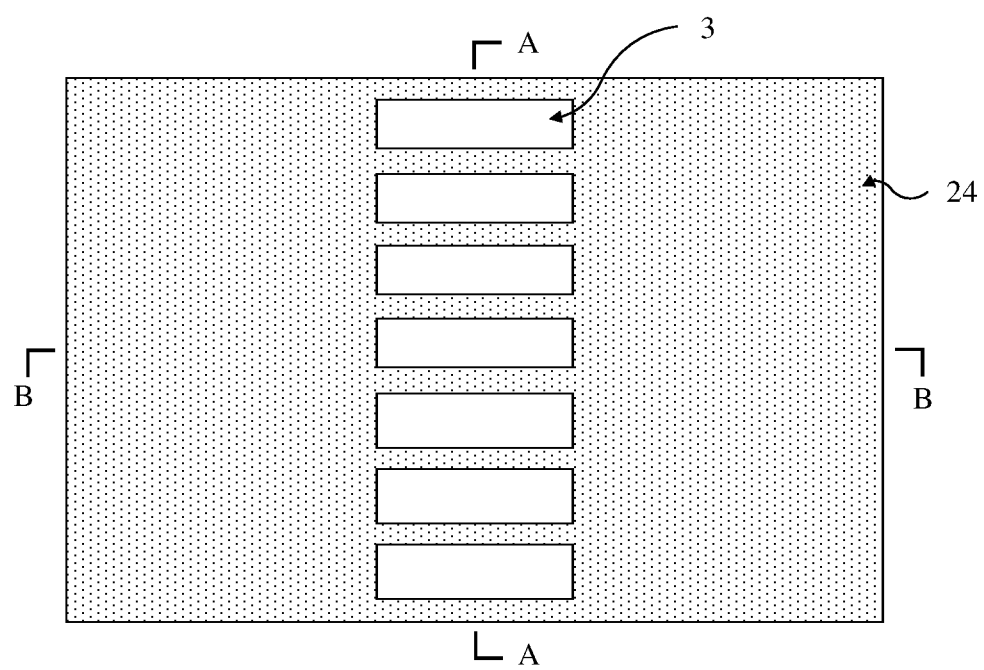
Figure 2B:
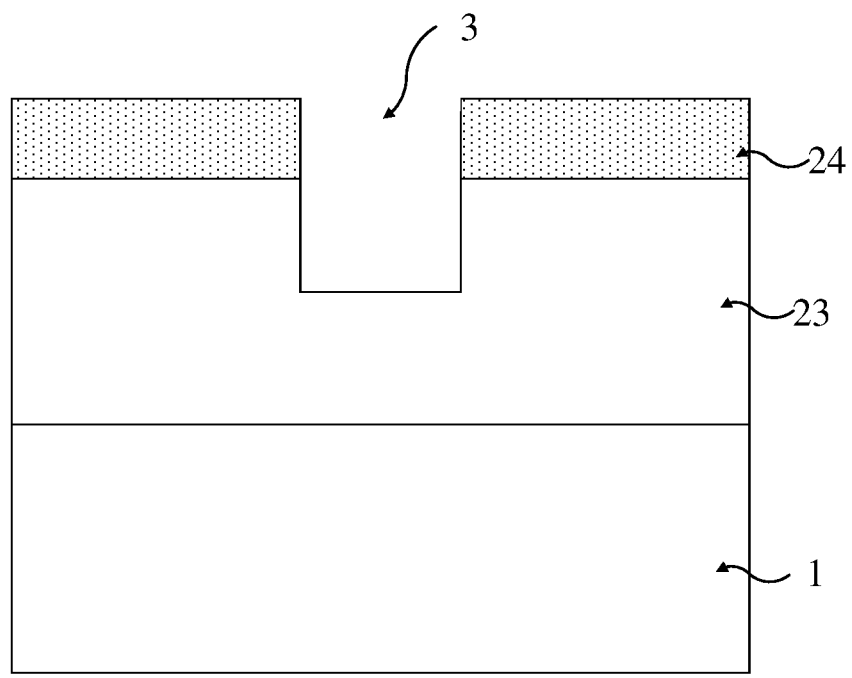
Figure 2C:
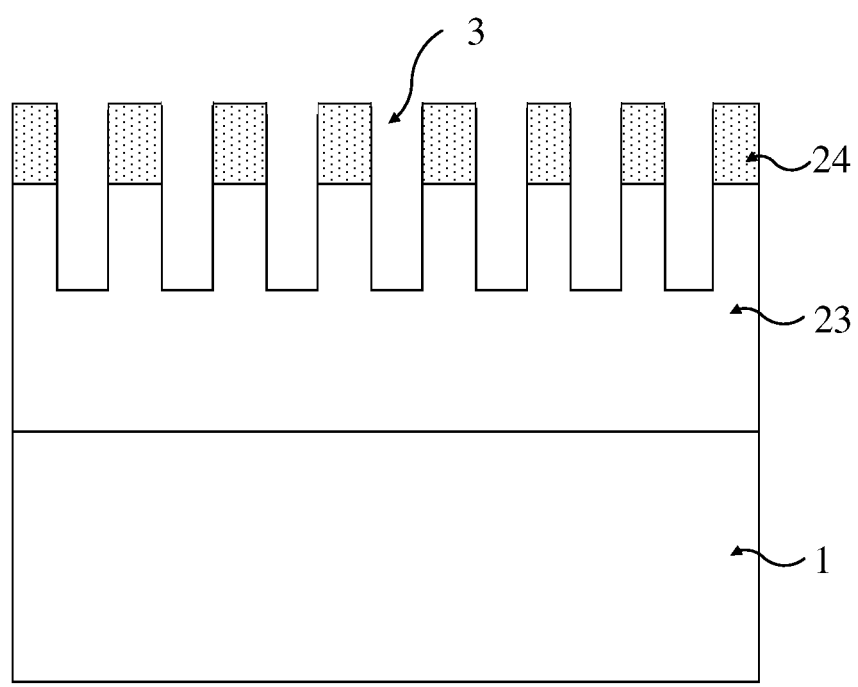

As shown in FIGS. 2a-2c, a plurality of trenches 3 extended into the channel layer 23 are prepared in a gate region of the barrier layer 24. FIG. 2a is an overhead view of FIG. 2b and FIG. 2c, FIG. 2b is a cross-section view of FIG. 2a along the profile line B-B, and FIG. 2c is a cross-section view of FIG. 2a along the profile line A-A.

The gate region in the present disclosure is a region for preparing a gate. It should be known by those skilled in the art that the gate region may be defined and determined according to a design requirement of relevant devices.

FIG. 2b is a cross-section view along the profile line B-B of the semiconductor structure shown in FIG. 2a, and FIG. 2c is a cross-section view along the profile line A-A of the semiconductor structure shown in FIG. 2a.

Figure 3A:
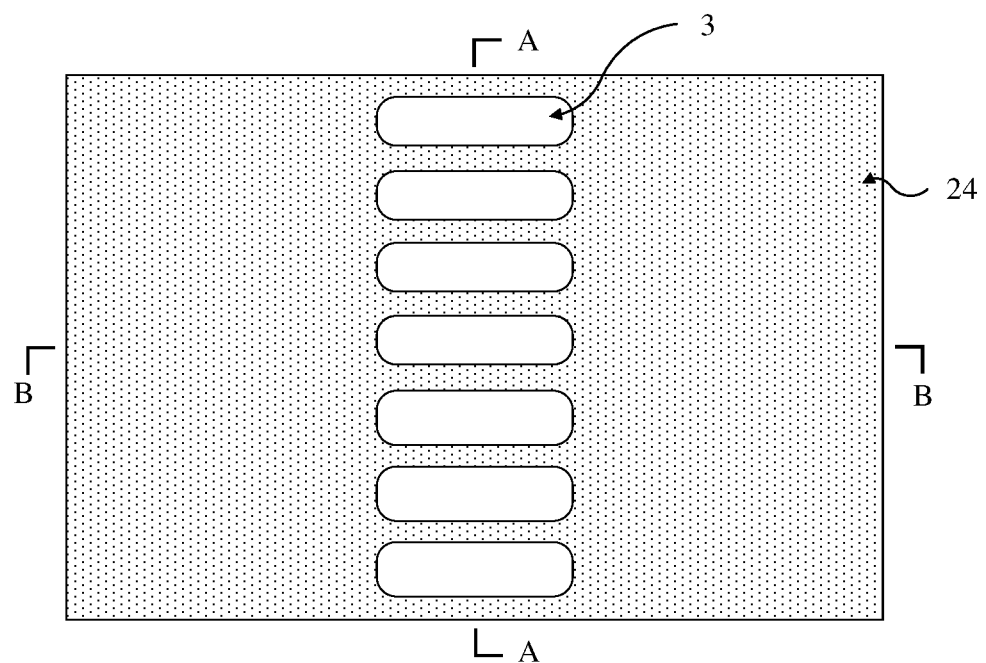
Figure 3B:
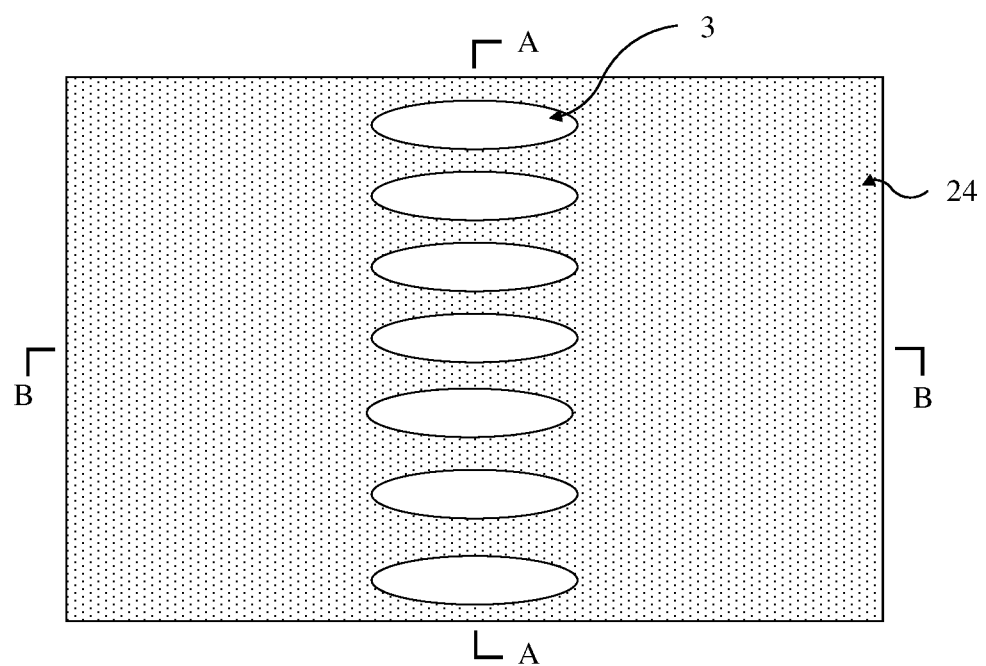

In an embodiment shown in FIG. 2a, an overhead shape of the trench 3 is a rectangle, however the overhead shape of the trench 3 is not particularly limited in the embodiments. As shown in FIG. 3a and FIG. 3b, the overhead shape of the trench 3 may be determined according to a specific design requirement, for example, a square, a circle, an oval shape or an irregular shape, etc.

Figure 4A:
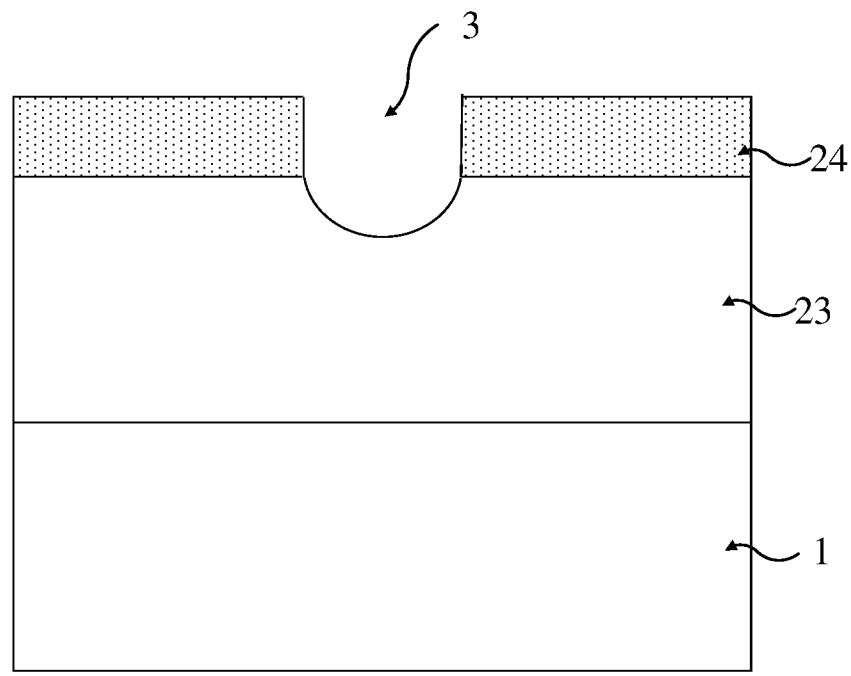
Figure 4B:
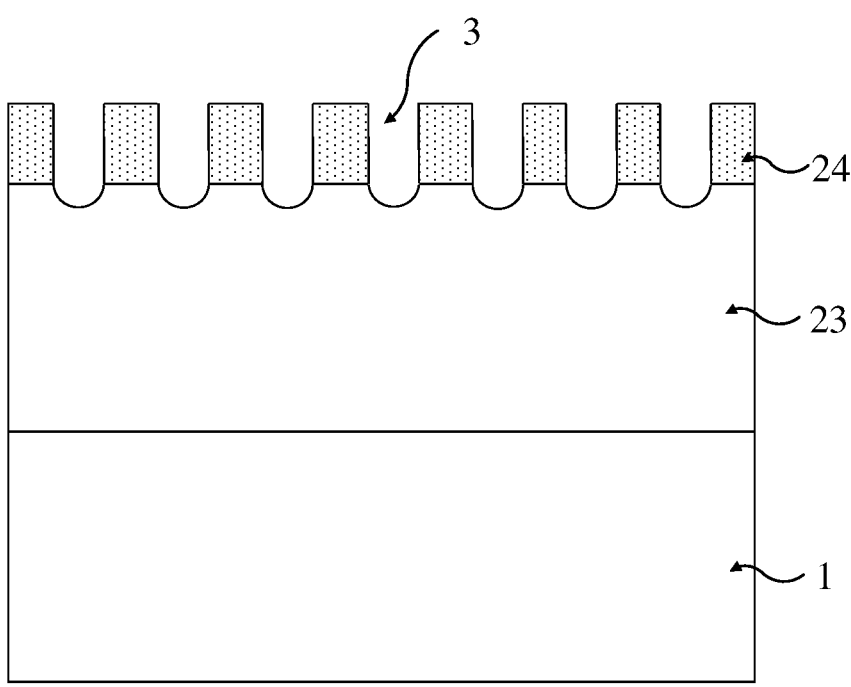

In an embodiment according to FIG. 2b and FIG. 2c, a cross-section shape of the trench 3, along the profile line B-B and the profile line A-A shown in FIG. 2a respectively, is a rectangle. But it is not particularly limited in the embodiments. As shown in FIG. 4a and FIG. 4b, the cross-section shape of the trench 3, along the profile line B-B and the profile line A-A shown in FIG. 2a respectively, may be determined according to a specific design requirement.

Figure 2D:
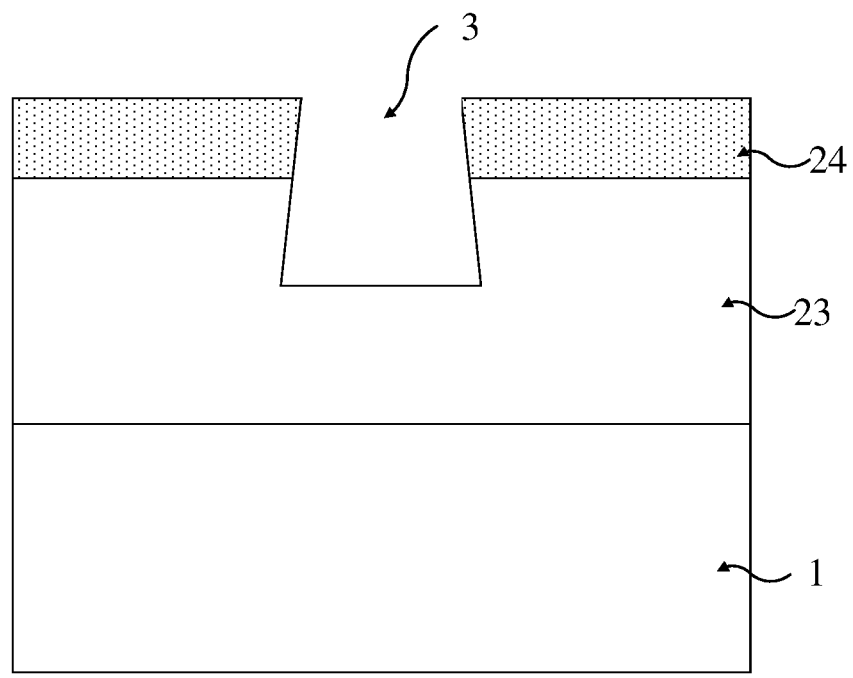
Figure 2E:
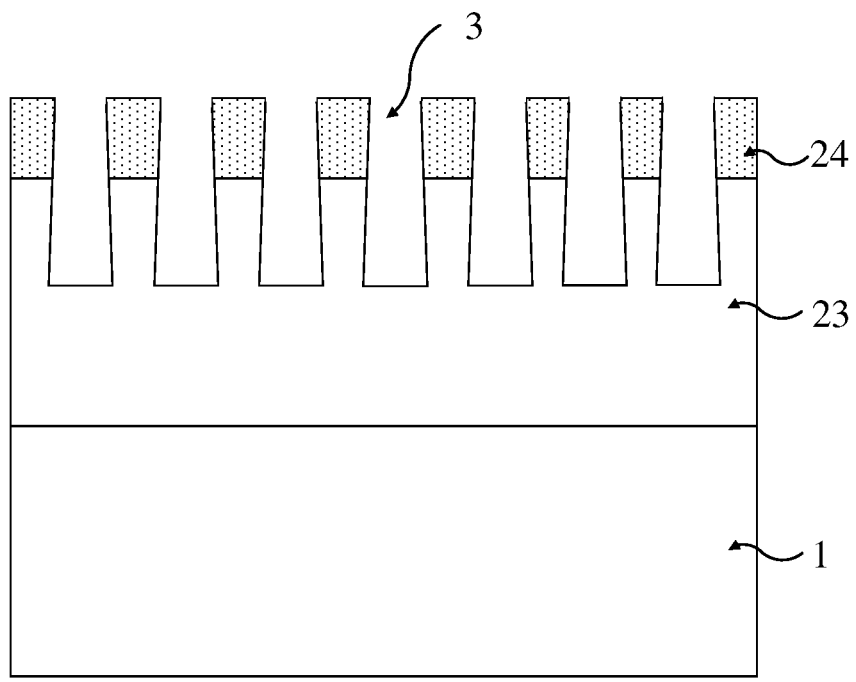

In an embodiment shown in FIG. 2b and FIG. 2c, a side wall of the trench 3 is perpendicular to an upper surface of the barrier layer 24, but it is not particularly limited in the embodiments. In another embodiment, as shown in FIG. 2d and FIG. 2e, the side wall of the trench 3 is not perpendicular to the upper surface of the barrier layer 24. An angle between the side wall of the trench 3 and the upper surface of the barrier layer 24 may be adjusted according to a design requirement.

Figure 5A:
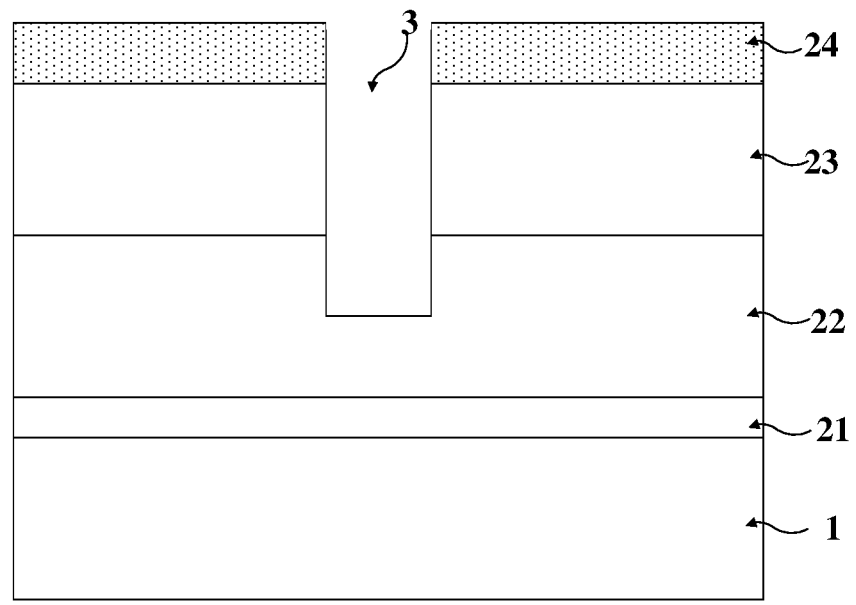
Figure 5B:
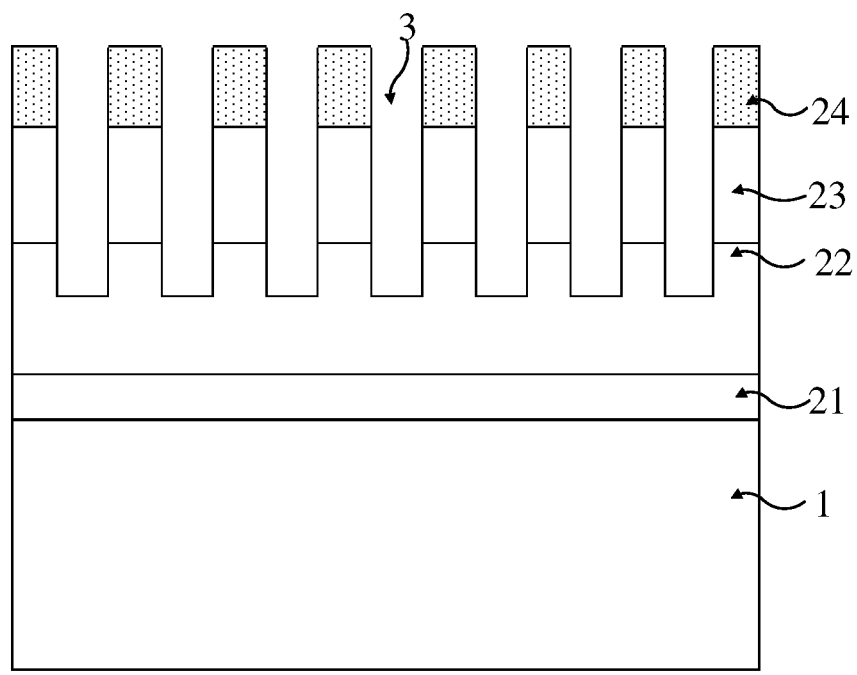

A depth of the trench 3 is not limited in the embodiments, as in the embodiment shown in FIGS. 2a-2c, the trench 3 is extended into the channel layer 23. In other embodiments, as shown in FIG. 5a and FIG. 5b, when a buffer layer is disposed, the trench 3 may be further extended into the buffer layer 22. FIG. 5a corresponds to FIG. 2b and FIG. 5b corresponds to FIG. 2c.

In an embodiment of FIGS. 2a-2c in the present disclosure, the plurality of trenches 3 are evenly arranged in the gate region. The trench 3 may be formed by an etching process such as chlorine based plasma etching. Certainly, a width and an interval of the plurality of trenches 3 are not strictly restricted by the present disclosure. The width and the interval of the plurality of trenches 3 may be determined according to a design requirement, as long as the two-dimensional electron gas can be depleted when cooperating with a stress applying material 4 that will be mentioned below.

In an embodiment of FIGS. 2a-2c in the present disclosure, the number of the trench 3 is 7, but the present disclosure is not limited to this. The number of the trench 3 can be determined according to a design requirement, that is, the number can be more or less as long as the two-dimensional electron gas can be depleted when cooperating with the depth, width and interval of the trench 3 and a stress buffer layer that will be mentioned below.

Figure 6A:
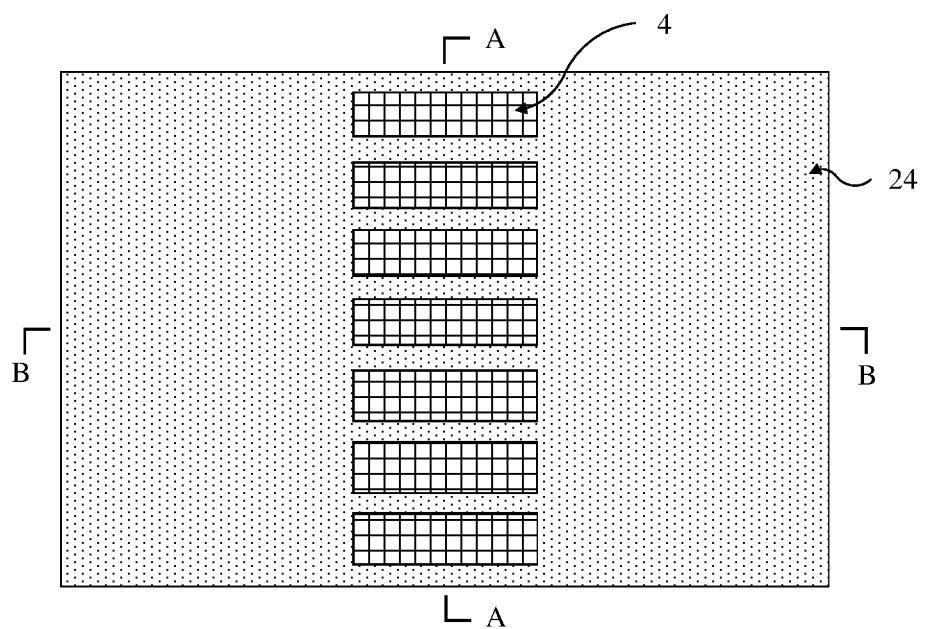
Figure 6B:
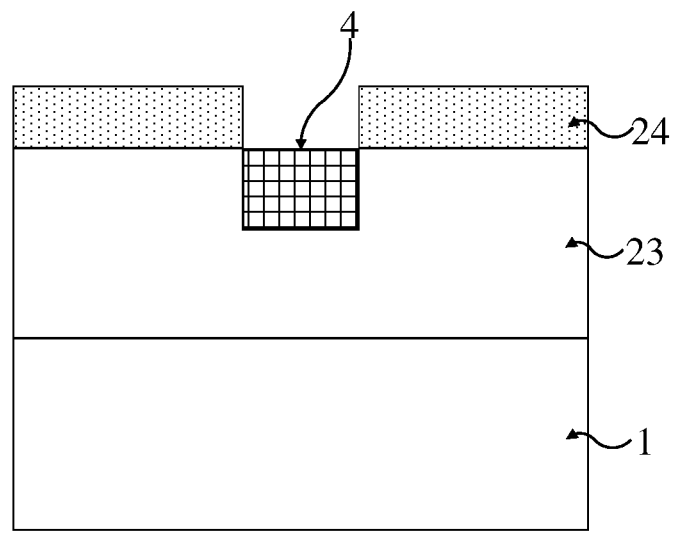
Figure 6C:
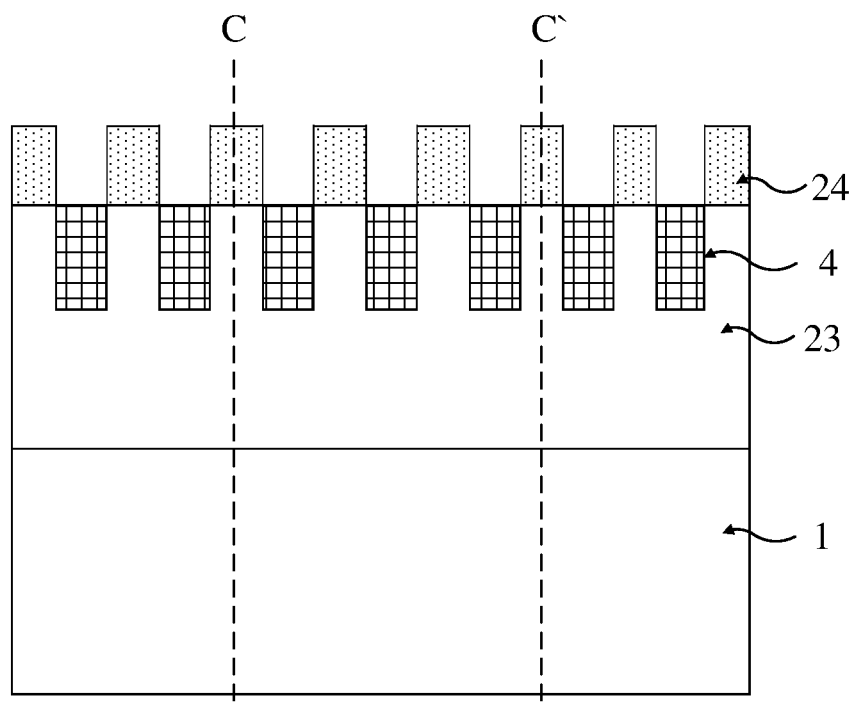

As shown in FIGS. 6a-6c, a stress applying material 4 is filled in the plurality of trenches 3. A lattice constant of the stress applying material 4 is greater than that of the channel layer 23. FIG. 6a is an overhead view of FIG. 6b and FIG. 6c, FIG. 6b is a cross-section view of FIG. 6a along the profile line B-B, and FIG. 6c is a cross-section view of FIG. 6a along the profile line A-A.

For example, when the material of the channel layer 23 is GaN and the material of the barrier layer 24 is AlGaN, the material of the stress applying material 4 may be InGaN, in which the lattice constant of InGaN is greater than that of GaN.

Figure 7A:
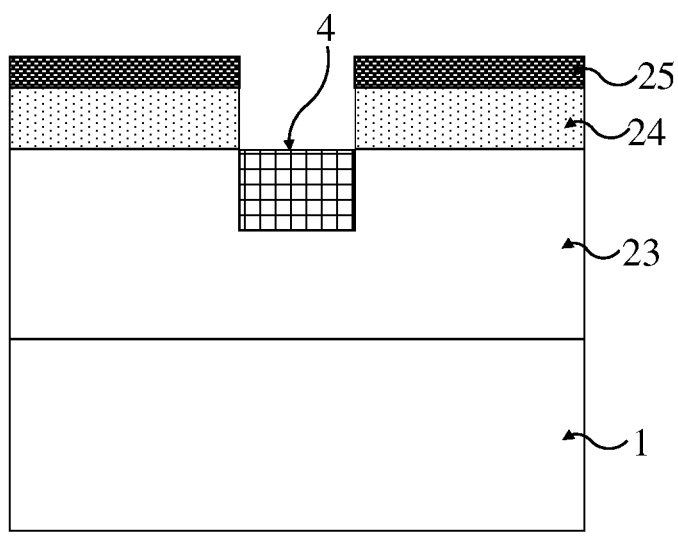
Figure 7B:
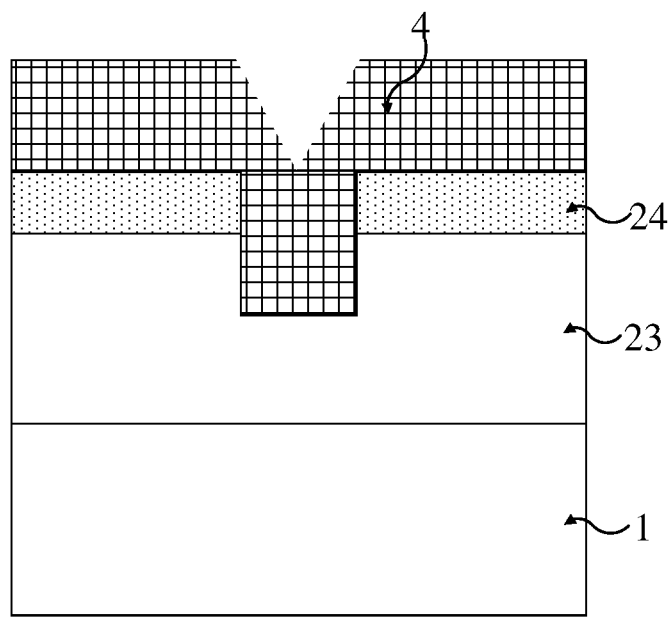

Filling the stress applying material 4 in the plurality of trenches 3 may be specifically achieved by, for example a selective filling method, directly filling the trench 3. As shown in FIG. 7a, which is corresponding to FIG. 6b, a protection layer 25 may be prepared on the barrier layer 24, and then the stress applying material 4 may be directly filled in the trench 3. The protection layer 25 may specifically be, for example, SiN, SiO$_2$ or a combination of the two. Filling the stress applying material 4 in the plurality of trenches 3 may also specifically achieved by, for example, full-sheet growing and then selectively etching the stress applying material 4. As shown in FIG. 7b, the stress applying material 4 is full-sheet grown and then performed a process such as selective etching or CMP and so on, to form a structure shown in FIG. 6b.

Figure 8:
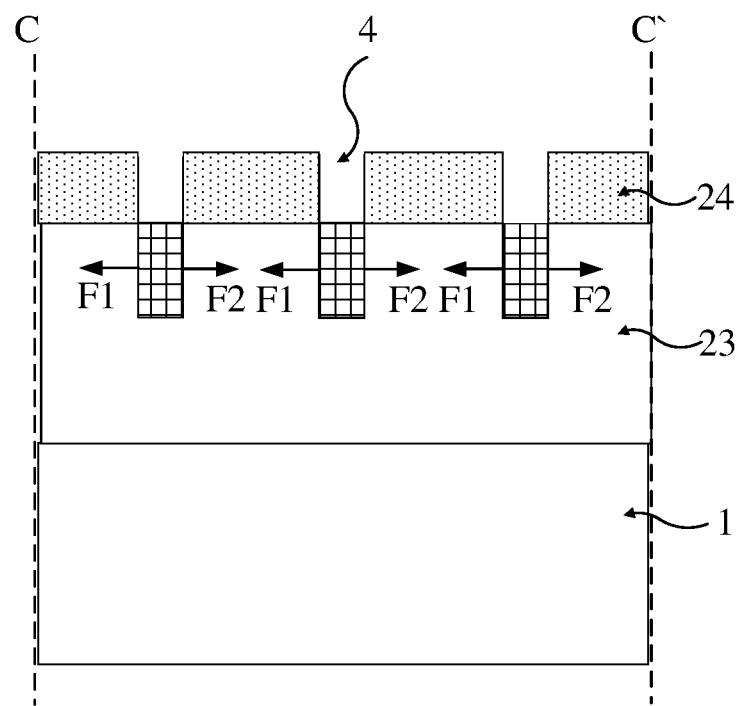

FIG. 8 is a partial structure between the dashed line C-C' in FIG. 6c, in which the lattice constant of the channel layer 23 is greater than that of the barrier layer 24, and the channel layer 23 may generate compressive strain in the lateral direction parallel to channel layer 23. As shown in FIG. 8, since the lattice constant of the stress applying material 4 is greater than that of the channel layer 23, the stress applying material 4 may apply stresses F1 and F2 to the channel layer 23 on both sides respectively, that is, the stress applying material 4 may cause the channel layer 23 to generate compressive strain in the lateral direction parallel to the channel layer 23. In this way, the tensile stress received by the barrier layer will be reduced, that is, the two-dimensional electron gas at the heterojunction interface between the channel layer 23 and the barrier layer 24 will be reduced, thereby achieving an enhancement-mode semiconductor switching device.

Figure 9A:
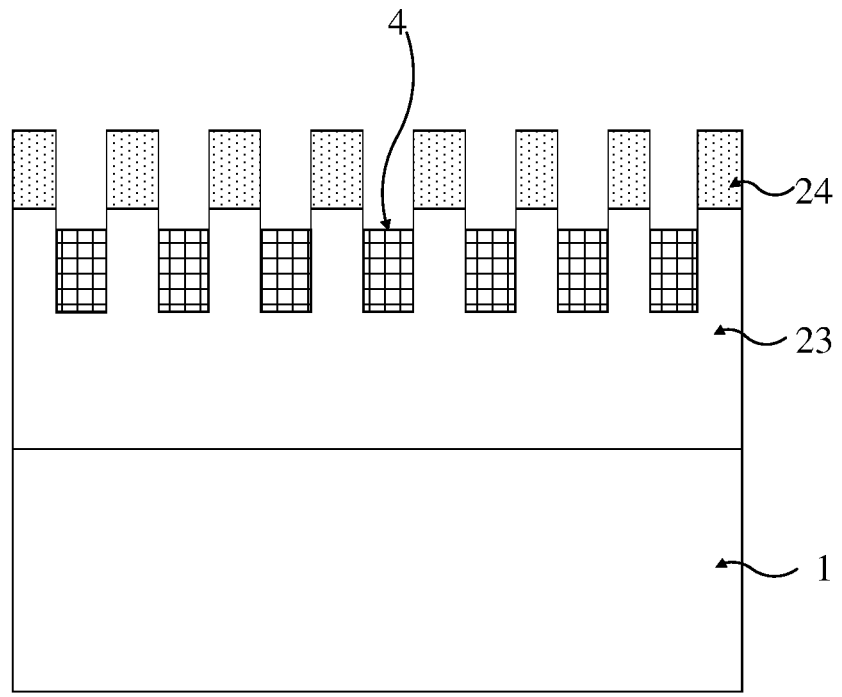
Figure 9B:
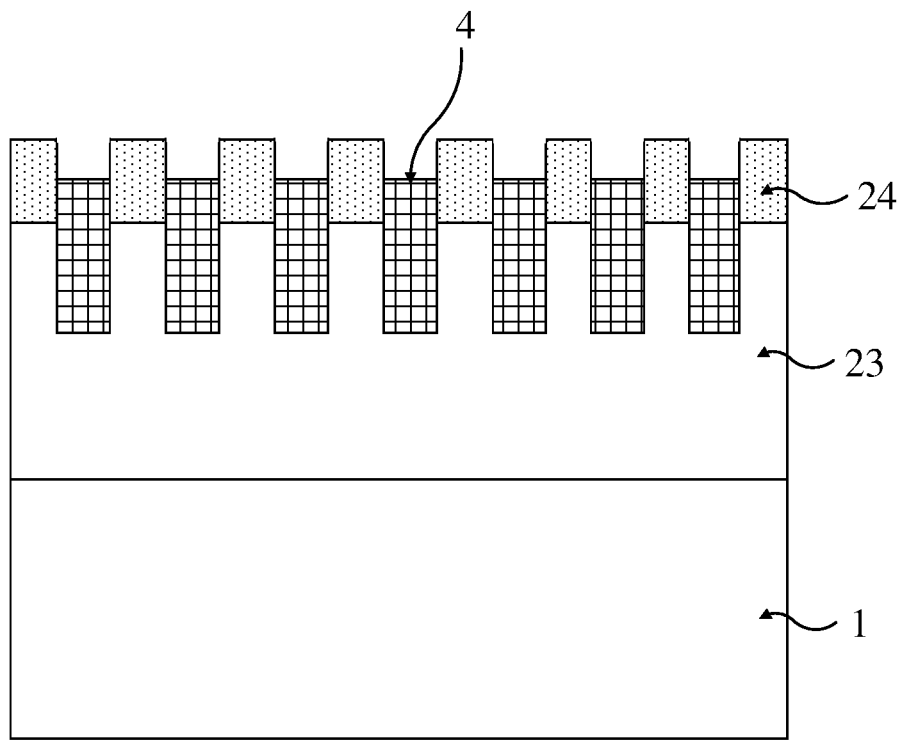
Figure 9C:
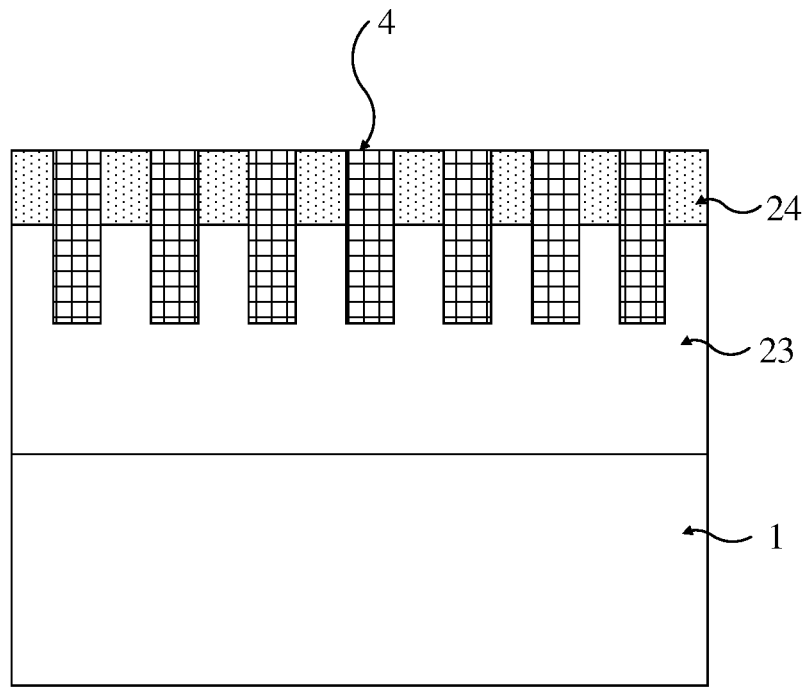
Figure 9D:
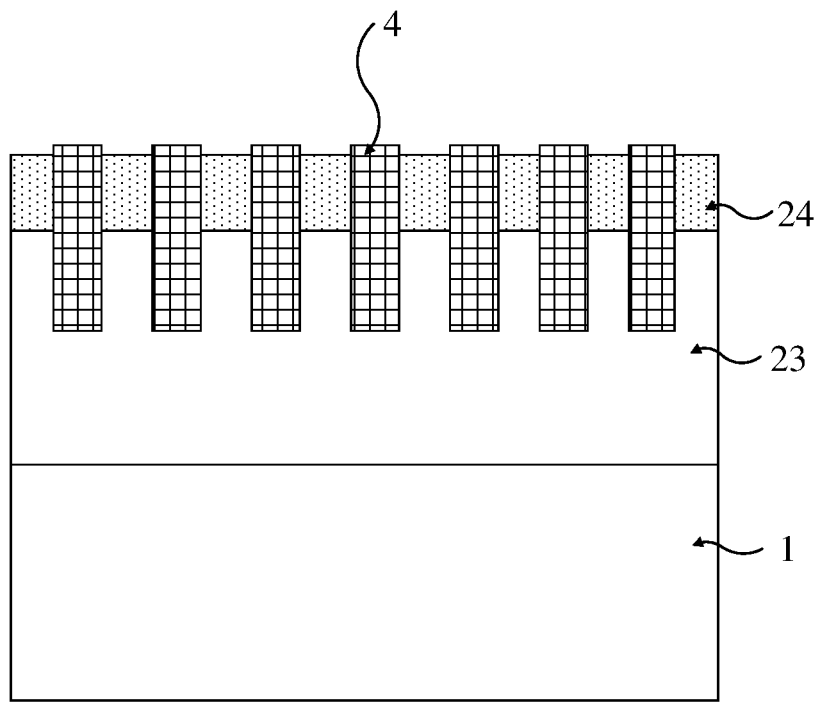

In FIG. 6c, the stress applying material 4 is only used to fill the part of the trench 3 corresponding to the channel layer 23. It should be understood that the filling depth of the stress applying material 4 filled in the trench 3 may be adjusted according to an actual application scenario. As shown in FIGS. 9a-9c, which are corresponding to FIG. 6c, the only difference among them is the filling depth of the stress applying material filled in the trench 3. As shown in FIG. 9a, the stress applying material 4 may be only used to partially fill the part of the trench 3 corresponding to the channel layer 23. Or, as shown in FIG. 9b, the stress applying material 4 may be used to fill the part of the trench 3 corresponding to the channel layer 23 as well as partially fill the part of the trench 3 corresponding to the barrier layer 24. More, as shown in FIG. 9c, the stress applying material 4 may be used to fill the part of the trench 3 corresponding to both the channel layer 23 and the barrier layer 24. Since it is difficult to control the stress applying material 4 be used to exactly fill the part of the trench 3 corresponding to both the channel layer 23 and the barrier layer 24, the upper surface of the stress applying material 4 may be slightly higher than the upper surface of the barrier layer 24 as shown in FIG. 9d.

In one embodiment of the present disclosure, to further enhance the depletion effect of the two-dimensional electron gas in the heterostructure of the channel layer 23 and the barrier layer 24, the stress applying material 4 filled in the trench 3 may be a p-type semiconductor material, such as p-type doped InGaN.

Figure 10A:
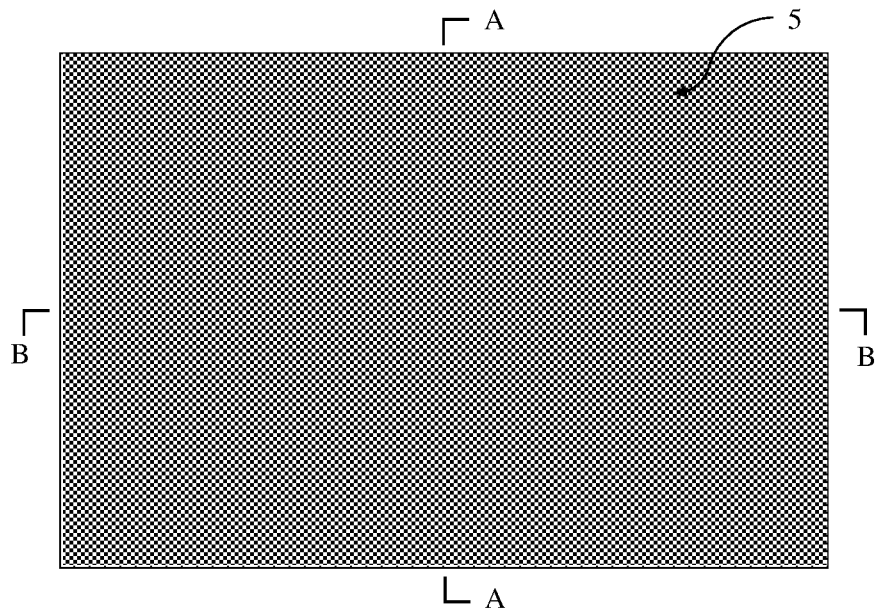
Figure 10B:
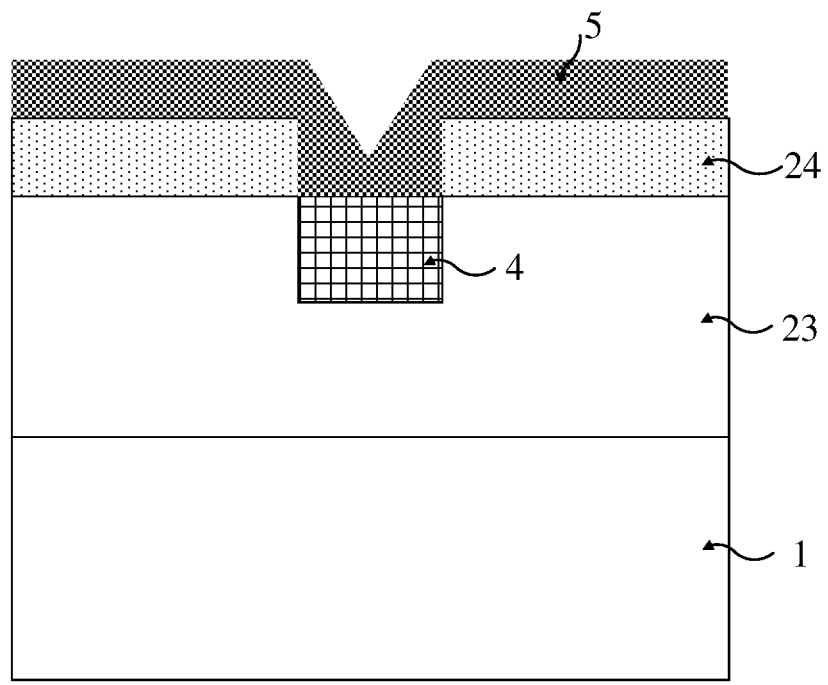
Figure 10C:
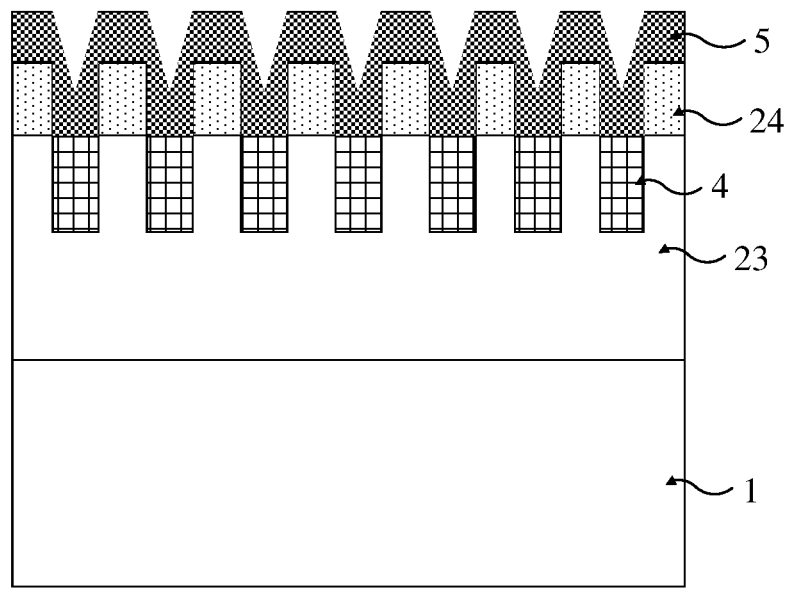

A dielectric layer 5 is prepared on a surface of the barrier layer 24 as shown in FIGS. 10a-10c, in which FIG. 10a is an overhead view of FIG. 10b and FIG. 10c, FIG. 10b is a cross-section view of FIG. 10a along the profile line B-B and FIG. 10c is a cross-section view of FIG. 10a along the profile line A-A.

A material of the dielectric layer 5 may include one or a combination of the following materials: $Al_2O_3$, AlON, SiON, $SiO_2$ and SiN.

Figure 11A:
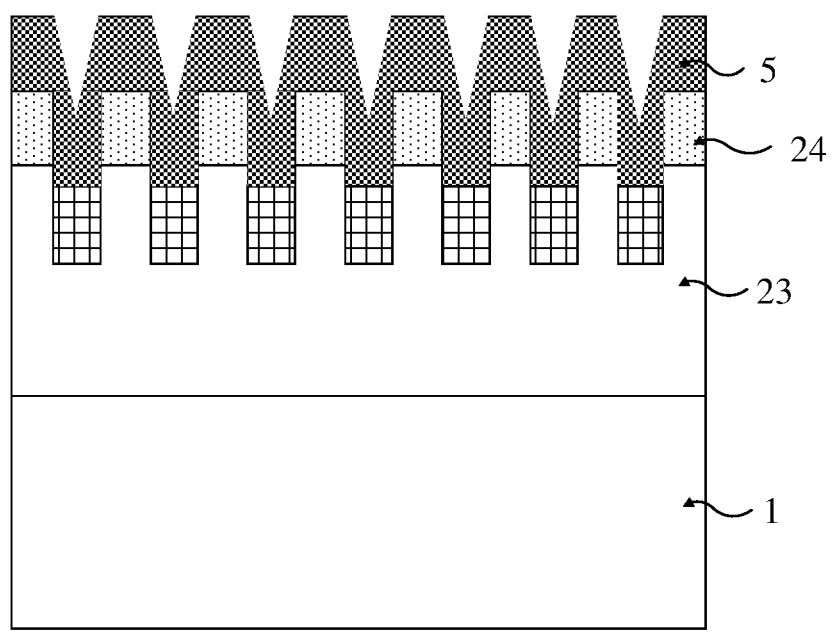
Figure 11B:
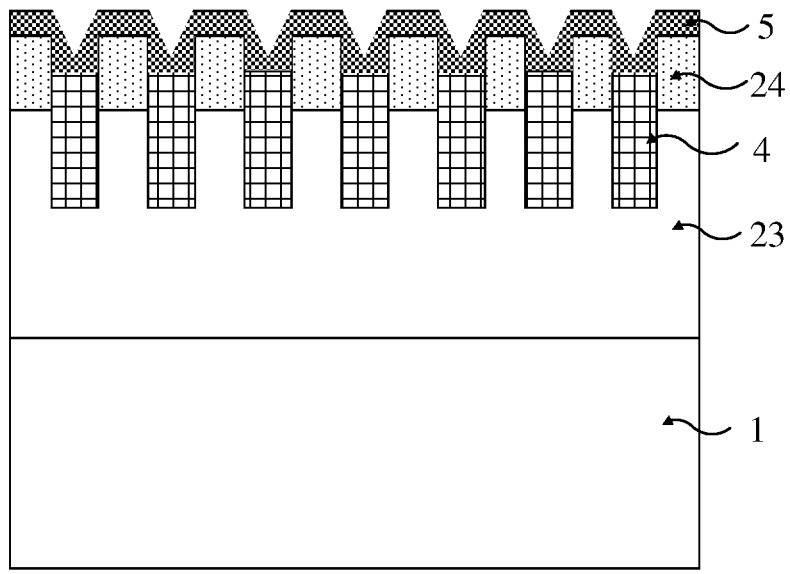
Figure 11C:
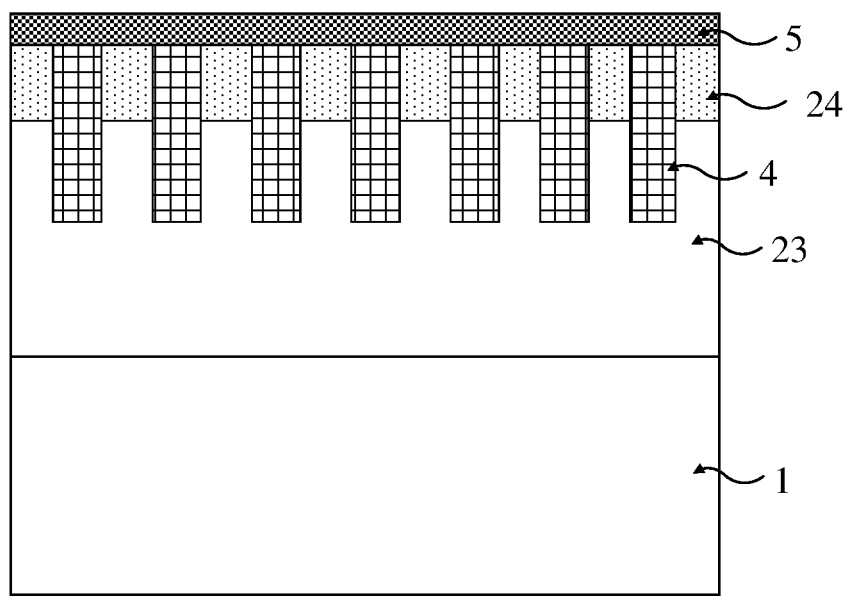

In FIG. 10c, the stress applying material 4 is only used to fill the part of the trench 3 corresponding to the channel layer 23. A specific shape of the dielectric layer 5 may be determined by the filling state of the trench 3 filled by the stress applying material 4, as shown in FIGS. 11a-11c. FIGS. 11a-11c are corresponding to FIG. 10c, the difference between FIGS. 11a-11c and FIG. 10c is that the shape of the dielectric layer 5 may change with the filling depth of the stress applying material 4 filled in the trench 3.

Figure 12A:
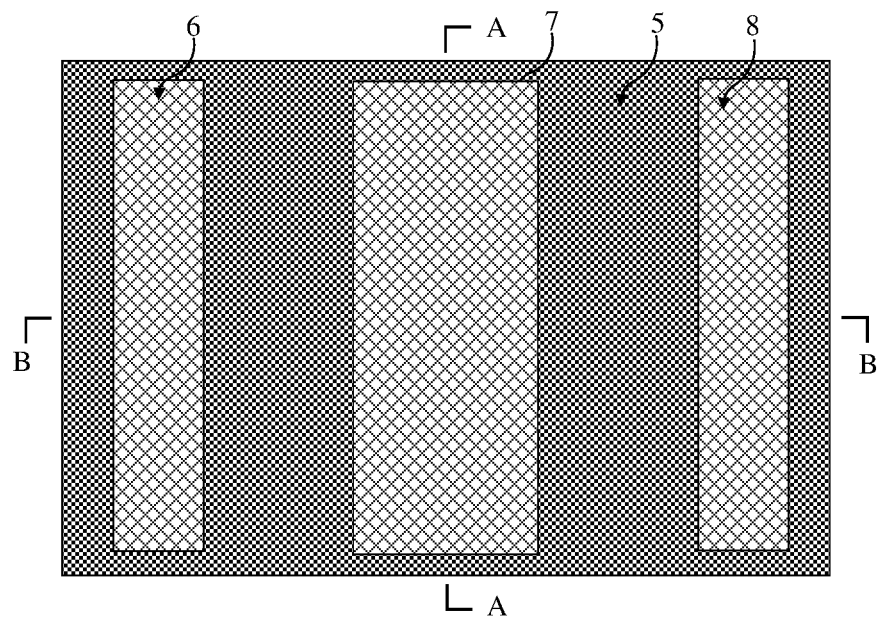
Figure 12B:
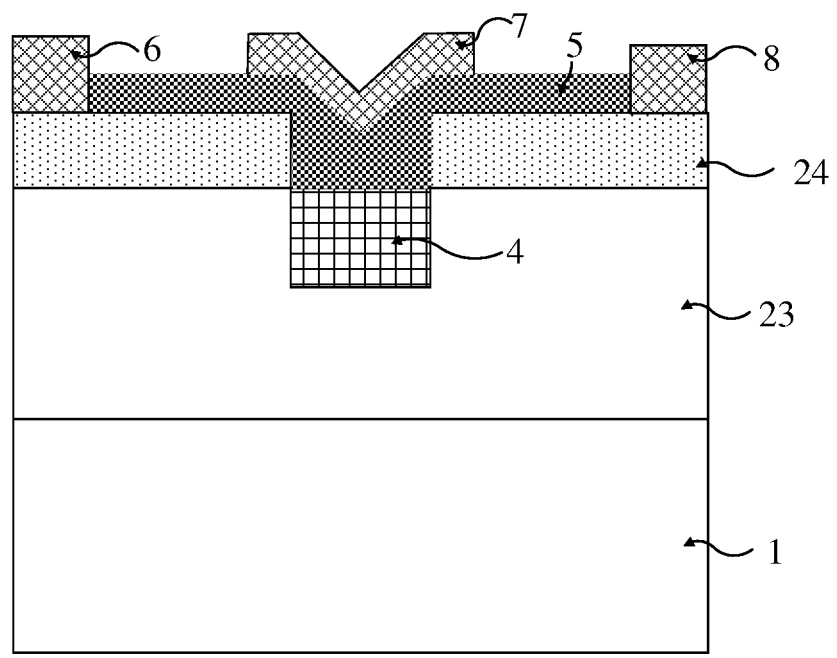
Figure 12C:
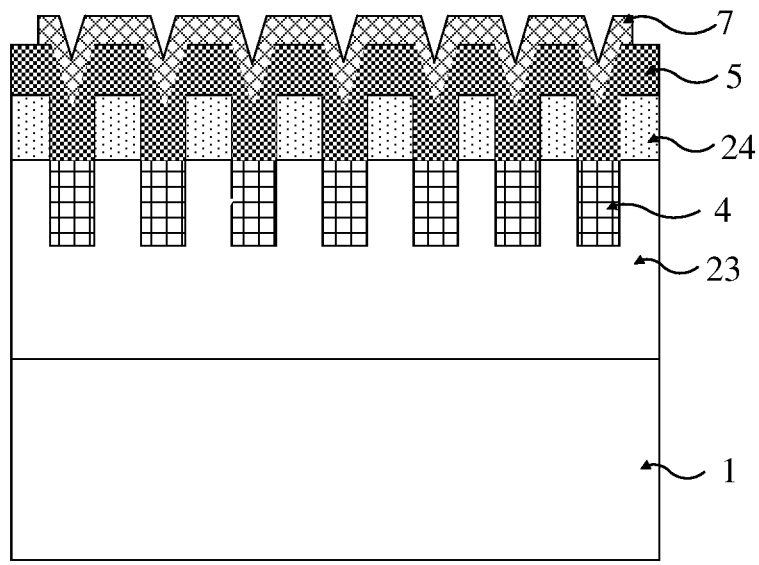

A gate electrode 7 is prepared in the gate region, a source electrode 6 is prepared in a source region, and a drain electrode 8 is prepared in a drain region as shown in FIG. 12a-12c, in which FIG. 12a is an overhead view of FIG. 12b and FIG. 12c, FIG. 12b is a cross-section view of FIG. 12a along the profile line B-B and FIG. 12c is a cross-section view of FIG. 12a along the profile line A-A.

The gate electrode may be directly prepared on the dielectric layer 5. However, before the source electrode 6 and the drain electrode 8 are prepared, the dielectric layer 5 in the source region and the drain region needs to be etched to make the source electrode 6 and the drain electrode 8 to form an ohmic contact with the barrier layer 24. The electrode material may be made of a metal material such as a nickel alloy. It may also be made of a metal oxide or a semiconductor material. The electrode material is not limited in the present disclosure.

Figure 13A:
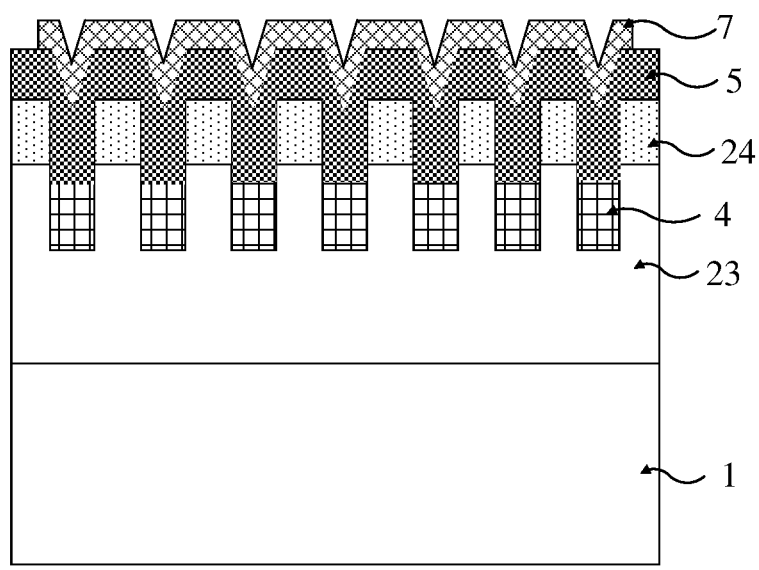
Figure 13B:
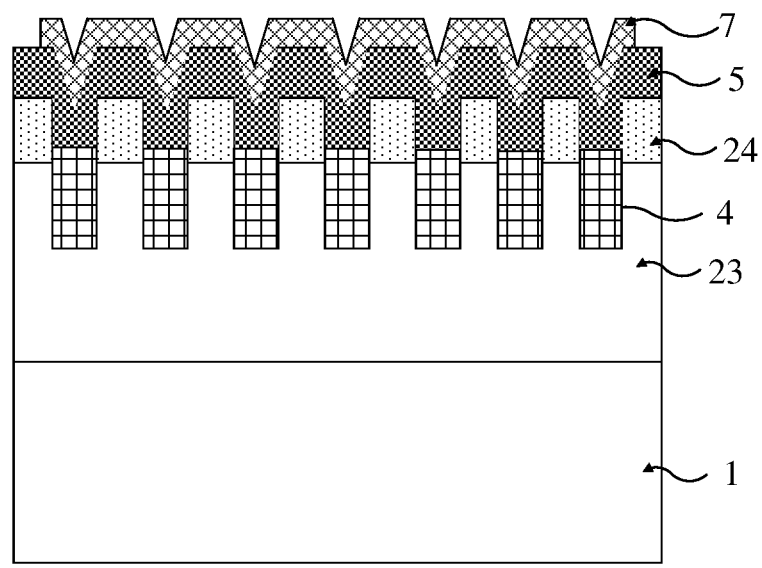
Figure 13C:
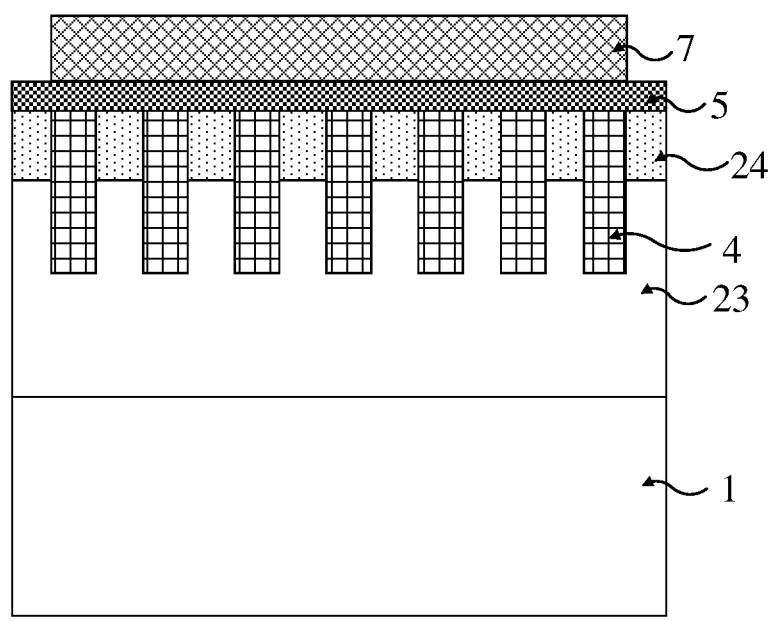

FIGS. 13a-13c are corresponding to FIG. 12c, the difference between FIGS. 13a-13c and FIG. 12c is that the shape of the gate electrode 7 may change with the filling depth of the stress applying material 4 filled in the trench 3.

Figure 14A:
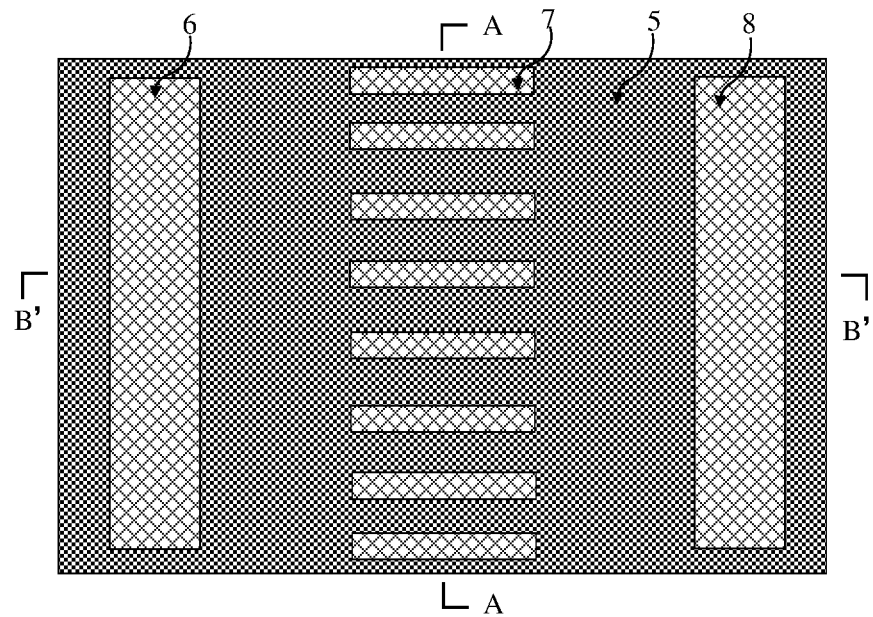
Figure 14B:
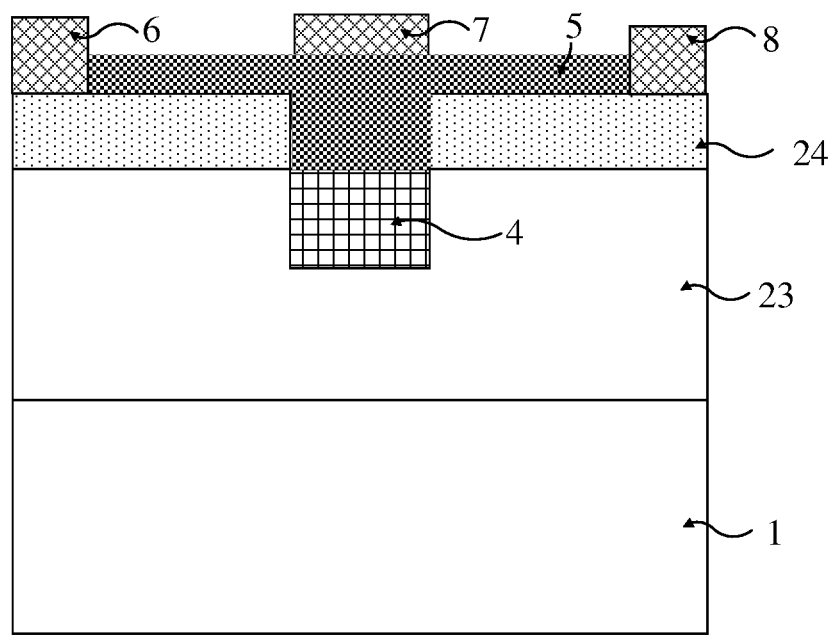
Figure 14C:
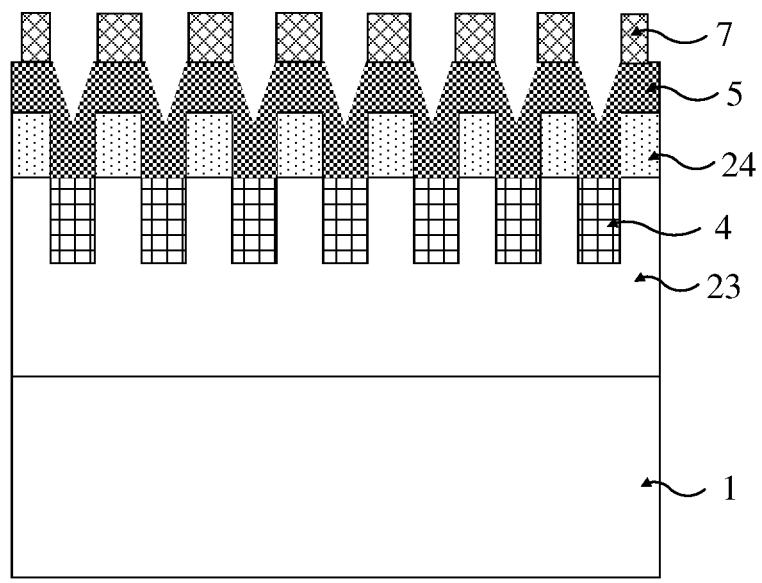

FIGS. 14a-14c illustrate a shape change of the gate electrode 7 in another embodiment. FIG. 14a is an overhead view of FIG. 14b and FIG. 14c, FIG. 14b is a cross-section view of FIG. 14a along the profile line B-B and FIG. 14c is a cross-section view of FIG. 14a along the profile line A-A. The difference FIG. 14c compared with FIG. 12c is that no gate electrode is provided in the trench 3.

Figure 15A:
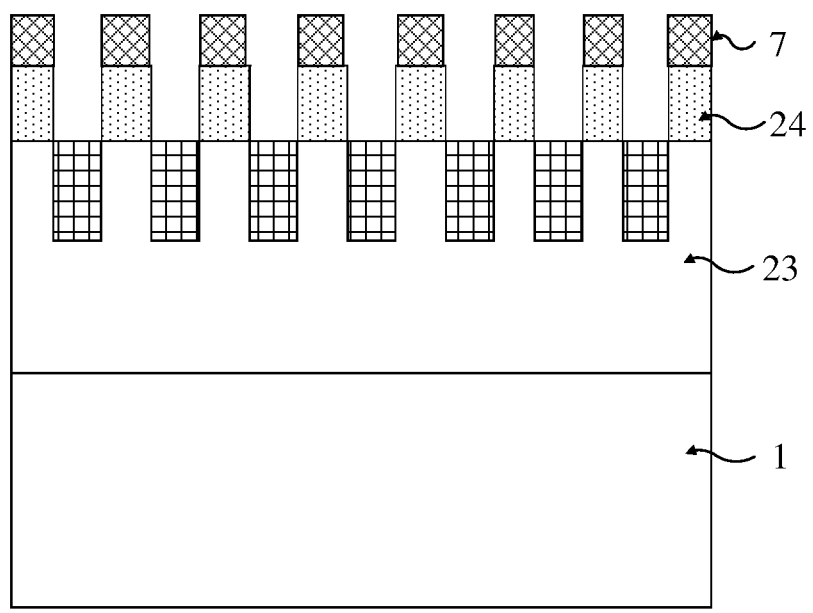
Figure 15B:
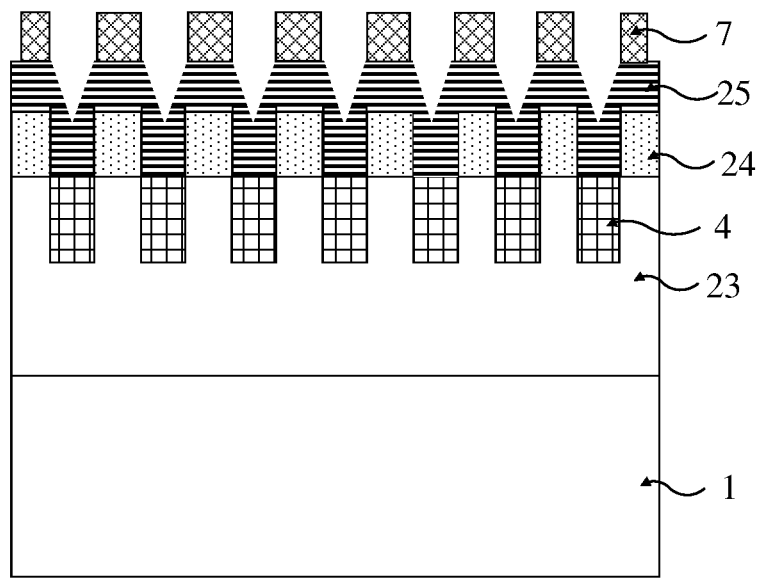
Figure 15C:
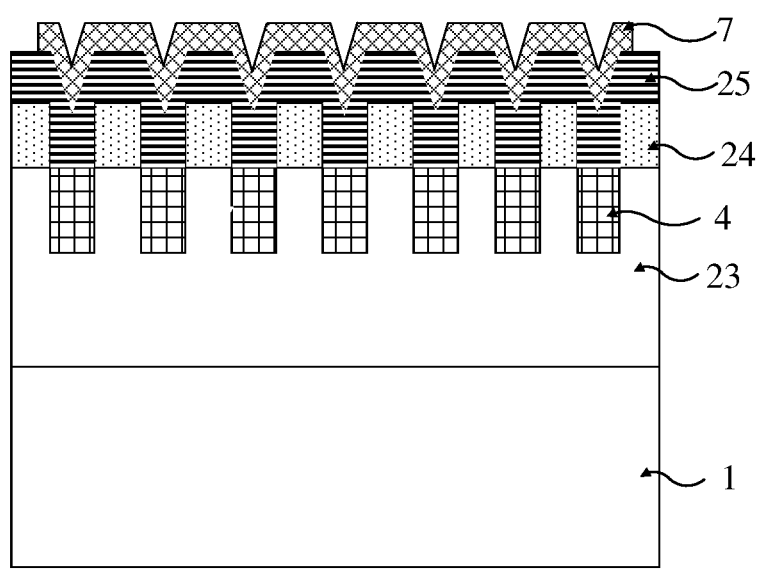
Figure 15D:
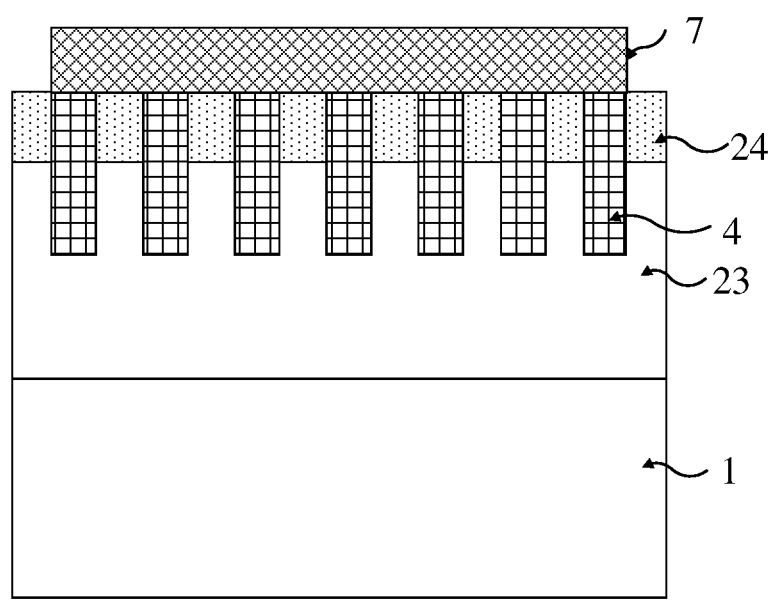

In an embodiment of the present disclosure, the step of preparing a dielectric layer 5 on a surface of the barrier layer 24 may be omitted. As shown in FIG. 15a, a gate electrode 7 may be prepared directly on the barrier layer 24, and the gate electrode 7 forms a Schottky contact with the barrier layer 24. Or, as shown in FIG. 15b, preparing a cap layer 25 on the barrier layer 24, and then preparing the gate electrode 7. The cap layer 25 may be formed by GaN-based semiconductor material.

A semiconductor structure is also provided in an embodiment of the present disclosure. As shown in FIG. 1a, the semiconductor structure may include: a channel layer 23 and a barrier layer 24 stacked in sequence on a substrate 1.

A material of the substrate 1 may be selected from a semiconductor material, a ceramic material or a polymer material, etc. For example, the material of the substrate 1 may be preferably selected from diamond, sapphire, silicon carbide, silicon, lithium niobate, silicon-on-insulator (SOI), gallium nitride, or aluminum nitride. Materials of the channel layer 23 and the barrier layer 24 may be semiconductor materials that can form a two-dimensional electron gas. For example, taking a GaN-based material as an example, the material of the channel layer 23 may be GaN and the material of the barrier layer 24 may be AlGaN or GaN, and the channel layer 23 and the barrier layer 24 may form a heterostructure to produce a two-dimensional electron gas.

In a further embodiment of the present disclosure, in order to improve the device performance and meet the relevant technical requirements, as shown in FIG. 1b, the semiconductor structure may further include a nucleation layer 21 and a buffer layer 22 disposed under the channel layer 23. Taking a GaN-based semiconductor structure as an example, the nucleation layer 21 prepared on the substrate 1 may be further included to meet the technical requirements such as reducing a dislocation density and a defect density, or improving the quality of the crystal, etc. A material of the nucleation layer 21 may be one or a combination of AN, AlGaN and GaN. In addition, the GaN-based semiconductor structure may further include the buffer layer 22 prepared on the nucleation layer 21 to buffer the stress in an epitaxial structure above the substrate and prevent the epitaxial structure from cracking. A material of the buffer layer 22 may be one or a combination of GaN, AlGaN and AlInGaN.

In an embodiment of the present disclosure, as shown in FIGS. 2a-2c, the semiconductor structure may further include a plurality of trenches 3 formed in a gate region. The plurality of trenches 3 may be extended into the channel layer 23. As shown in FIGS. 5a-5b, when a buffer layer 22 is disposed, the plurality of trenches 3 may also be extended into the buffer layer 22.

In an embodiment of the present disclosure, as shown in FIGS. 6a-6c, the semiconductor structure may further include a stress applying material 4 filled in the plurality of trenches 3. A lattice constant of the stress applying material 4 is greater than that of the channel layer 23. In FIGS. 6a-6c, the stress applying material 4 is only used to fill the part of the plurality of trenches 3 corresponding to the channel layer 23. In another embodiment, as shown in FIGS. 9a-9c, the filling depth of the stress applying material in the plurality of trenches 3 may be determined according to a design requirement.

In an embodiment of the present disclosure, the material of the channel layer 23 may include GaN, the material of the barrier layer 24 may include AlGaN, and the material of the stress applying material 4 may include InGaN. The lattice constant of the InGaN is greater than that of the GaN.

In an embodiment of the present disclosure, in order to further enhance the depletion effect of the two-dimensional electron gas in the heterostructure of the channel layer 23 and the barrier layer 24, the stress applying material 4 filled in the plurality of trenches 3 may be a p-type semiconductor material, for example, a p-type doped InGaN.

In an embodiment of the present disclosure, as shown in FIGS. 10a-10c, the semiconductor structure may further include a dielectric layer 5. A material of the dielectric layer 5 may include one or a combination of the following materials: $Al_2O_3$, AlON, SiON, $SiO_2$ and SiN. A shape of the dielectric layer 5 may be determined according to a shape of the stress applying material 4, as shown in FIGS. 11a-11c.

In an embodiment of the present disclosure, as shown in FIGS. 12a-12c, the semiconductor structure may further include a gate electrode 7 disposed in the gate region, a source electrode 6 disposed in a source region and a drain electrode 8 disposed in a drain region.

The electrode material may be made of a metal material such as a nickel alloy. It may also be made of a metal oxide or a semiconductor material. The electrode material is not limited in the present disclosure.

It should be understood that although this specification is described in terms of the embodiments, each embodiment does not merely include an independent technical solution. This representation of the specification is for clarity only, and those skilled in the art shall take the specification as a whole. The technical solutions in the embodiments may be suitably combined to form other embodiments that can be understood by those skilled in the art.

The series of detailed descriptions listed above are only specific descriptions of possible implementations of the present disclosure. They are not intended to limit the protection scope of the present disclosure. Any equivalent implementations or changes made without departing from the technical spirit of the present disclosure shall be included in the protection scope of the present disclosure.

What is claimed is:

1. A semiconductor structure, comprising:
a channel layer and a barrier layer stacked in sequence;
a plurality of trenches formed in a gate region of the barrier layer, wherein the plurality of trenches are extended into the channel layer; and
a stress applying material filled in the plurality of trenches, wherein a lattice constant of the stress applying material is greater than that of the channel layer, the stress applying material is a material that generates strain due to a piezoelectric polarization effect, and a strain direction of the stress applying material due to the piezoelectric polarization effect is opposite to a strain direction of the barrier layer due to the piezoelectric polarization effect.

2. The semiconductor structure according to claim 1, wherein a material of the channel layer comprises GaN, a material of the barrier layer comprises AlGaN, and a material of the stress applying material comprises InGaN.

3. The semiconductor structure according to claim 1, wherein the stress applying material is a p-type semiconductor material.

4. The semiconductor structure according to claim 1, further comprising:
a dielectric layer prepared on the barrier layer.

5. The semiconductor structure according to claim 4, wherein a material of the dielectric layer comprises one or a combination of: Al2O3, AlON, SiON, SiO2 and SiN.

6. The semiconductor structure according to claim 1, wherein the stress applying material is used to fill each trench of the plurality of trenches corresponding to the channel layer;
the stress applying material is used to partially fill each trench of the plurality of trenches corresponding to the channel layer;
the stress applying material is used to fill each trench of the plurality of trenches corresponding to the channel layer and partially fill each trench of the plurality of trenches corresponding to the barrier layer; or
the stress applying material is used to fill each trench of the plurality of trenches corresponding to both the channel layer and the barrier layer.

7. The semiconductor structure according to claim 1, further comprising:
a gate electrode in the gate region, a source electrode in a source region and a drain electrode in a drain region which are disposed above the barrier layer.

8. The semiconductor structure according to claim 1, wherein a side wall of each trench of the plurality of trenches is not perpendicular to an upper surface of the barrier layer.

9. The semiconductor structure according to claim 1, further comprising:
a nucleation layer and a buffer layer disposed between a substrate and the channel layer.

10. The semiconductor structure according to claim 9, wherein the plurality of trenches are further extended into the buffer layer.

11. The semiconductor structure according to claim 1, wherein the plurality of trenches are evenly arranged in the gate region.

12. A method for manufacturing a semiconductor structure, comprising the following steps:
preparing a channel layer and a barrier layer stacked in sequence;
preparing, in a gate region of the barrier layer, a plurality of trenches extended into the channel layer; and filling a stress applying material in the plurality of trenches respectively, wherein a lattice constant of the stress applying material is greater than that of the channel layer, the stress applying material is a material that generates strain due to a piezoelectric polarization effect, and a strain direction of the stress applying material due to the piezoelectric polarization effect is opposite to a strain direction of the barrier layer due to the piezoelectric polarization effect.

13. The method according to claim 12, wherein a material of the channel layer comprises GaN, a material of the barrier layer comprises AlGaN, and a material of the stress applying material comprises InGaN.

14. The method according to claim 12, wherein the stress applying material is a p-type semiconductor material.

15. The method according to claim 12, further comprising:
preparing a dielectric layer on a surface of the barrier layer, wherein the dielectric layer covers the barrier layer.

16. The method according to claim 12, wherein the stress applying material is used to fill each trench of the plurality of trenches corresponding to the channel layer;
the stress applying material is used to partially fill each trench of the plurality of trenches corresponding to the channel layer;
the stress applying material is used to fill each trench of the plurality of trenches corresponding to the channel layer and partially fill each trench of the plurality of trenches corresponding to the barrier layer; or
the stress applying material is used to fill each trench of the plurality of trenches corresponding to both the channel layer and the barrier layer.

17. The method according to claim 12, further comprising:
preparing a gate electrode in the gate region, a source electrode in a source region and a drain electrode in a drain region which are disposed above the barrier layer.

18. The method according to claim 12, wherein a side wall of each trench of the plurality of trenches is not perpendicular to an upper surface of the barrier layer.

19. The method according to claim 12, further comprising:
preparing a nucleation layer and a buffer layer, wherein the nucleation layer and the buffer layer are disposed between a substrate and the channel layer.

20. The method according to claim 19, wherein the plurality of trenches are further extended into the buffer layer.

* * * * *